United States Patent
Meier

(10) Patent No.: US 11,327,482 B2
(45) Date of Patent: May 10, 2022

(54) APPARATUSES, METHODS AND COMPUTER PROGRAMS FOR A TRANSPORTATION VEHICLE AND A CENTRAL OFFICE

(71) Applicant: VOLKSWAGEN AKTIENGESELLSCHAFT, Wolfsburg (DE)

(72) Inventor: Andreas Meier, Magdeburg (DE)

(73) Assignee: Volkswagen Aktiengesellschaft

(*) Notice: Subject to any disclaimer, the term of this patent is extended or adjusted under 35 U.S.C. 154(b) by 232 days.

(21) Appl. No.: 16/343,212

(22) PCT Filed: Oct. 17, 2017

(86) PCT No.: PCT/EP2017/076447
§ 371 (c)(1),
(2) Date: Apr. 18, 2019

(87) PCT Pub. No.: WO2018/073230
PCT Pub. Date: Apr. 26, 2018

(65) Prior Publication Data
US 2019/0258243 A1   Aug. 22, 2019

(30) Foreign Application Priority Data
Oct. 20, 2016 (DE) .................. 10 2016 220 619.2

(51) Int. Cl.
*G05D 1/00* (2006.01)
*G06N 20/00* (2019.01)
(Continued)

(52) U.S. Cl.
CPC ......... *G05D 1/0027* (2013.01); *G05D 1/0088* (2013.01); *G06F 9/46* (2013.01);
(Continued)

(58) Field of Classification Search
CPC .... G05D 1/0027; G05D 1/0088; G06N 20/00; G06F 30/20; G06F 9/46; G06F 9/50; G06F 9/5083
(Continued)

(56) References Cited

U.S. PATENT DOCUMENTS 5,922,040 A * 7/1999 Prabhakaran .......... G08G 1/127
  701/532
6,198,920 B1 * 3/2001 Doviak ............... H04L 67/2823
  455/560
(Continued)

FOREIGN PATENT DOCUMENTS

CN    103620659 A  *  3/2014  ......... G08G 1/09623
CN    104464274 A  *  3/2015
(Continued)

OTHER PUBLICATIONS

Xue et al., "Special Equipment Railway Transportation Communication Net Based on the Field Bus," 2007, Publisher: IEEE.*
(Continued)

*Primary Examiner* — Tuan C To
(74) *Attorney, Agent, or Firm* — Barnes & Thornburg, LLP

(57) ABSTRACT

Apparatuses, methods and computer programs for a transportation vehicle and a central office. The apparatus includes a communication module for communication with a central office and a computation module for controlling the communication module. The computation module receives a partial task of a distributed data processing from the central office, computes the partial task of the distributed data processing to obtain a result of the partial task, and provides the result of the partial task for the central office.

6 Claims, 4 Drawing Sheets

(51) Int. Cl.
*G06F 9/50* (2006.01)
*G06F 9/46* (2006.01)
*G06F 30/20* (2020.01)

(52) U.S. Cl.
CPC .............. *G06F 9/50* (2013.01); *G06F 9/5083* (2013.01); *G06F 30/20* (2020.01); *G06N 20/00* (2019.01)

(58) Field of Classification Search
USPC .......................................................... 701/2
See application file for complete search history.

(56) References Cited

U.S. PATENT DOCUMENTS

| | | | | |
|---|---|---|---|---|
| 7,373,243 | B2 * | 5/2008 | Tengler | G08G 1/096883 701/484 |
| 8,275,522 | B1 * | 9/2012 | Groeneweg | G06Q 10/06 701/50 |
| 9,412,271 | B2 * | 8/2016 | Sharma | G08G 1/22 |
| 9,864,957 | B2 * | 1/2018 | Rennie | G06Q 10/00 |
| 2002/0065599 | A1 * | 5/2002 | Hameleers | G08G 1/096861 701/117 |
| 2002/0077748 | A1 * | 6/2002 | Nakano | G08G 1/20 701/410 |
| 2004/0143466 | A1 * | 7/2004 | Smith | G08G 1/202 705/6 |
| 2005/0068191 | A1 * | 3/2005 | Eschke | B60R 16/0231 345/169 |
| 2005/0222755 | A1 * | 10/2005 | Tengler | G08G 1/096827 701/484 |
| 2008/0094250 | A1 * | 4/2008 | Myr | G08G 1/04 340/909 |
| 2009/0093952 | A1 * | 4/2009 | Lassiter, Sr. | G08G 1/01 701/117 |
| 2011/0296037 | A1 | 12/2011 | Westra et al. | |
| 2012/0253551 | A1 | 10/2012 | Halimi et al. | |
| 2013/0304863 | A1 | 11/2013 | Reber | |
| 2014/0310702 | A1 * | 10/2014 | Ricci | G08G 1/096844 717/173 |
| 2016/0344747 | A1 * | 11/2016 | Link, II | H04W 4/80 |
| 2017/0132477 | A1 * | 5/2017 | Kim | G08G 1/096791 |
| 2017/0132914 | A1 * | 5/2017 | Dannat | G06Q 10/047 |

FOREIGN PATENT DOCUMENTS

| | | | |
|---|---|---|---|
| CN | 104464274 B * | 9/2016 | |
| DE | 112011100166 T5 | 10/2012 | |
| DE | 102015200422 A1 | 7/2015 | |
| EP | 2816533 A1 | 12/2014 | |
| WO | WO-2013079247 A1 * | 6/2013 | ............. A01D 41/12 |
| WO | WO-2014056572 A1 * | 4/2014 | ......... G01C 21/3415 |

OTHER PUBLICATIONS

C.R. Grant, "Communication networks in transportation," 1995, Publisher: IET.*
Ying et al., "Cooperative Transportation by Multiple Robots with Machine Learning," 2006, Publisher: IEEE.*
Beberg et al.; Folding@home: Lesson From Eight Years of Volunteer Distributed Computing; IEEE International Symposium on Parallel and Distributed Processing; May 23, 2009; pp. 1-8.
Castro et al.; Volunteer Computing Approach for the Collaborative Simulation of Electrophysiological Models; IEEE 25th International Conference on Enabling Technologies: Infrastructure for Collaborative Enterprises; Jun. 13, 2016; pp. 118-123.
Gerla et al.; Internet of Vehicles: From Intelligent Grid to Autonomous Cars and Vehicular Clouds; IEEE World Forum on Internet of Things (WF-IoT); 2014; pp. 241-246.
Ghazizadeh et al.; Towards Fault-Tolerant Job Assignment in Vehicular Cloud Computing; IEEE International Conference on Services Computing; Jun. 27, 2015; pp. 17-24.
Heien et al.; Computing Low Latency Batches with Unreliable Workers in Volunteer Computing Environments; Journal of Grid Computing; Aug. 25, 2009; vol. 7, No. 4; pp. 501-518.
Ionescu; Resource Management in Mobile Cloud Computing; Informatica Economica; 2015; vol. 19, No. 2; pp. 55-66.
NVIDIA; The Next Volkswagen Golf: Now with Tegra; The Official NVIDIA Blog; Sep. 28, 2012; downloaded from https://blogs.nvidia.com/blog/2012/09/28/the-next-volkswagen-golf-now-with-tegra-2/.
Upadhyaya; Parallel approaches to machine learning—A comprehensive survey; J. Parallel Distrib. Comput.; 2013; vol. 73; pp. 284-292.
Whaiduzzaman et al.; A survey on vehicular cloud computing; Journal of Network and Computer Applications; 2014; vol. 40; pp. 325-344.
Wikipedia; Connected car; Oct. 19, 2016; downloaded from https://en.wikipedia.org/w/index.php?title=Connected_car&oldid=745111696.
Search Report for International Patent Application No. PCT/EP2017/076447; dated Jan. 30, 2018.

* cited by examiner

APPARATUSES, METHODS AND COMPUTER PROGRAMS FOR A TRANSPORTATION VEHICLE AND A CENTRAL OFFICE

PRIORITY CLAIM

This patent application is a U.S. National Phase of International Patent Application No. PCT/EP2017/076447, filed 17 Oct. 2017, which claims priority to German Patent Application No. 10 2016 220 619.2, filed 20 Oct. 2016, the disclosures of which are incorporated herein by reference in their entireties.

SUMMARY

Illustrative embodiments relate to an apparatus and a method for a transportation vehicle, an apparatus and a method for a central office, and computer programs, more specifically, but not exclusively, to apparatuses for computing partial tasks of a distributed data processing by computation modules of transportation vehicles.

BRIEF DESCRIPTION OF THE DRAWINGS

Disclosed embodiments are described in greater detail below as illustrated in the drawings, to which, however, exemplary embodiments generally are not restricted overall. In the figures.

DETAILED DESCRIPTION

Figure 1:
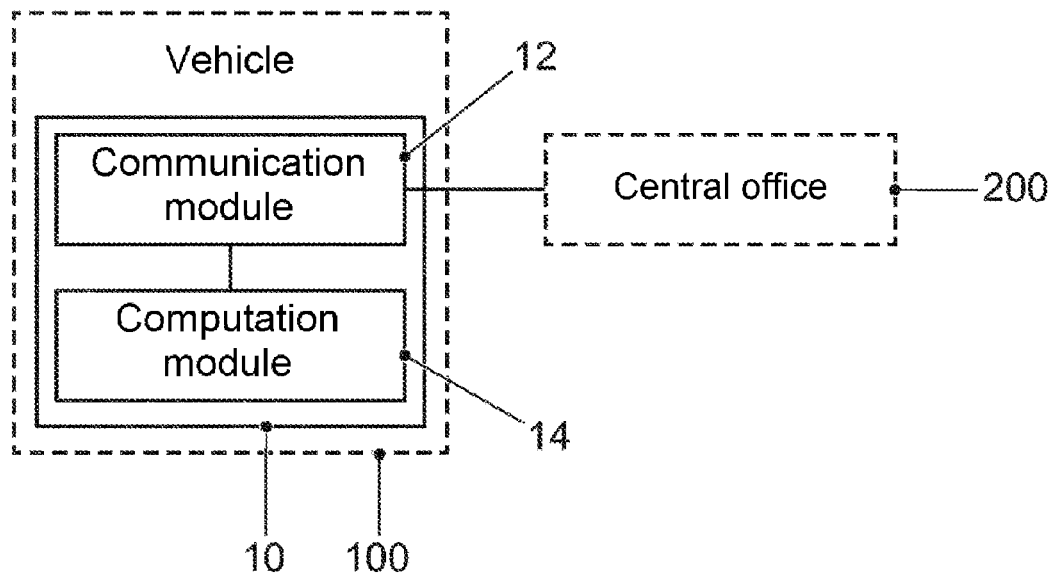
FIG. 1 shows a block diagram of an apparatus for a transportation vehicle.

Nowadays the design of transportation vehicles is manifested by computers in many cases: both in the design process for representing possible options of a design, and in technical development, for instance, for simulating engine or transmission components or for carrying out air flow simulations for identifying aerodynamic properties of a transportation vehicle design. In addition, machine learning gives rise to possibilities for improving properties of transportation vehicles and components by learning algorithms, for instance, by automated and evolutionary testing of options. Both simulations and machine learning algorithms often require large amounts of computing power to arrive at results within an acceptable time.

There is therefore a need for an improved concept for providing computing power for carrying out extensive data processing. This concept is taken into account by the independent claims.

Exemplary embodiments provide apparatuses, methods and computer programs for transportation vehicles and a central office. The central office can be configured, for example, to select transportation vehicles for the processing of partial tasks of a data processing on the basis of one or more criteria, for instance, computing power or availability, and to provide the partial tasks to the corresponding transportation vehicles. The partial tasks are processed by compute units of the transportation vehicles, and a result is returned to the central office. The central office can compile the results and provide the compiled result.

Exemplary embodiments provide an apparatus for a transportation vehicle. The apparatus comprises a communication module, configured for communication with a central office. The apparatus furthermore comprises a computation module, configured for controlling the communication module. The computation module is furthermore configured for receiving a partial task of a distributed data processing from the central office. The computation module is furthermore configured for computing the partial task of the distributed data processing to obtain a result of the partial task. The computation module is furthermore configured for providing the result of the partial task for the central office.

Computing the partial tasks by transportation vehicles can enable a distributed processing of the data processing on a multiplicity of computation modules, for instance, for providing computational capacity for accomplishing data processing tasks which can largely be parallelized.

In at least some exemplary embodiments, the computation module can be configured to provide a notification about a non-availability of the transportation vehicle for computing the partial task for the central office if the apparatus is deactivated before the partial task is computed. This can, for example, enable the central office to provide the partial task to a further transportation vehicle instead of the transportation vehicle.

In some exemplary embodiments, the computation module can be configured to compute the partial task on the basis of an architecture having one instruction for a plurality of data sets (also referred to as Single Instruction, Multiple Data, SIMD) or on the basis of a stream processor. SIMD architectures or stream processors can enable a more efficient computation of parallelizable data processing tasks.

In some exemplary embodiments, the computation module can furthermore be configured to communicate via the communication module with one or a plurality of further transportation vehicles to exchange results of partial tasks with the one or the plurality of further transportation vehicles. This can enable, for example, nearest neighbor communication for accomplishing the data processing more efficiently.

Exemplary embodiments furthermore provide an apparatus for a central office. The apparatus comprises a communication module, configured for communication with a plurality of transportation vehicles. The apparatus furthermore comprises a control module, configured for controlling the communication module. The control module is furthermore configured for providing partial tasks of a distributed data processing for the plurality of transportation vehicles for a distributed computation of the distributed data processing. The control module is furthermore configured for receiving results of the partial tasks of the distributed data processing from the plurality of transportation vehicles. The control module is furthermore configured for compiling the results of the distributed data processing on the basis of the (received) results of the partial tasks.

Computing the partial tasks by transportation vehicles can enable a distributed processing of the data processing on a multiplicity of computation modules, for instance, for providing computational capacity for accomplishing data processing tasks which can largely be parallelized.

In at least some exemplary embodiments, the control module can be configured to select the plurality of transportation vehicles from a group of transportation vehicles. Selecting a transportation vehicle to be selected for the plurality of transportation vehicles can be based on at least one element from the group of system capacity utilization of a computation module of the transportation vehicle to be selected, energy capacity of the transportation vehicle to be selected, performance of the computation module of the transportation vehicle to be selected, connectivity of the transportation vehicle to be selected, position of the transportation vehicle to be selected, expected availability of the transportation vehicle to be selected for a computation of a partial task, previous processing of a partial task by the transportation vehicle to be selected, and prioritization of the transportation vehicle to be selected for computations. This can enable a distribution of the partial tasks to transportation vehicles that are available for the data processing, for example, on account of their capabilities or their availability.

By way of example, the control module can be configured to provide the partial tasks multiply or in mutually overlapping state to the plurality of transportation vehicles. As a result, a redundancy in the processing of partial tasks can be made possible, which can reduce a time for the processing of the entire data processing over all the partial tasks.

By way of example, the control module can be configured to provide partial tasks that are not computed within a time window by one transportation vehicle of the plurality of transportation vehicles to another transportation vehicle of the plurality of transportation vehicles for computation. By way of example, the control module can be configured to provide a partial task that was provided to one transportation vehicle which is at least temporarily not available to another transportation vehicle of the plurality of transportation vehicles for computation. As a result, in some cases, a total duration of the data processing can be reduced or a complete processing can be made possible.

In at least some exemplary embodiments, the control module can be configured, for the purpose of initiating the process of providing the partial tasks for the transportation vehicles of the plurality of transportation vehicles, to contact the transportation vehicles of the plurality of transportation vehicles (referred to as the push principle). An active distribution of the partial tasks can be made possible as a result.

Alternatively or additionally, the control module can be configured, for the purpose of initiating the process of providing a partial task for a transportation vehicle of the plurality of transportation vehicles, to receive a request of the transportation vehicle (referred to as the pull principle). As a result, by way of example, the transportation vehicles can make their computational capacities available if they are available for computations.

By way of example, the partial tasks can comprise instructions that are executable independently of a specific hardware architecture of a computation unit of a transportation vehicle of the plurality of transportation vehicles, for instance, in an intermediate language (for instance, a byte code or a code of a programming language for distributed computation). This can enable a cross-model computation of the partial tasks.

Exemplary embodiments furthermore provide a method for a transportation vehicle. The method comprises receiving a partial task of a distributed data processing from a central office. The method furthermore comprises computing the partial task of the distributed data processing to obtain a result of the partial task. The method furthermore comprises providing the result of the partial task for the central office.

Exemplary embodiments furthermore provide a method for a central office. The method comprises providing partial tasks of a distributed data processing for a plurality of transportation vehicles for a distributed computation of a distributed data processing. The method furthermore comprises receiving results of the partial tasks of the distributed data processing from the plurality of transportation vehicles. The method furthermore comprises compiling the results of the distributed data processing on the basis of the results of the partial tasks.

Exemplary embodiments furthermore provide a program comprising a program code for carrying out at least one of the methods when the program code is executed on a computer, a processor, a control module or a programmable hardware component.

Various exemplary embodiments will now be described more thoroughly with reference to the accompanying drawings, in which some exemplary embodiments are illustrated. In the figures, the thickness dimensions of lines, layers and/or regions may be illustrated in an exaggerated manner for the sake of clarity.

In the following description of the accompanying figures, which show only a few exemplary embodiments by way of example, identical reference signs may designate identical or comparable components. Furthermore, summarizing reference signs may be used for components and objects which occur multiply in an exemplary embodiment or in a drawing but are described jointly with regard to one or more features. Components or objects which are described with identical or summarizing reference signs may be embodied identically, but if appropriate also differently, with regard to individual, a plurality or all of the features, for example, their dimensioning, provided that the description does not explicitly or implicitly reveal something to the contrary.

Although exemplary embodiments may be modified and amended in various ways, exemplary embodiments are illustrated as examples in the figures and are described thoroughly herein. It should be clarified, however, that there is no intention to restrict exemplary embodiments to the forms respectively disclosed, rather that exemplary embodiments are intended to cover all functional and/or structural modifications, equivalents and alternatives that lie within the scope of the disclosed embodiments. Identical reference signs designate identical or similar elements throughout the description of the figures.

It should be noted that one element designated as "connected" or "coupled" to another element may be directly connected or coupled to the other element, or intervening elements may be present. By contrast, if one element is designated as "directly connected" or "directly coupled" to another element, no intervening elements are present. Other terms used to describe the relationship between elements should be interpreted in a similar way (e.g., "between" vis-à-vis "directly therebetween", "adjacent" vis-à-vis "directly adjacent", etc.).

The terminology used herein serves merely to describe specific exemplary embodiments and is not intended to restrict the exemplary embodiments. As used herein, the singular forms "a", "an" and "the" are also intended to encompass the plural forms, as long as the context does not unambiguously indicate something else. Furthermore, it should be clarified that the expressions such as, e.g., "includes", "including", "has", "comprises", "comprising" and/or "having", as used herein, indicate the presence of the stated features, integers, operations, work sequences, elements and/or components, but do not exclude the presence or the addition of one or one or more features, integers, operations, work sequences, elements, components and/or groups thereof.

Unless defined otherwise, all terms used herein (including technical and scientific terms) have the same meaning ascribed to them by a person of average skill in the art in the field to which the exemplary embodiments belong. Furthermore, it should be clarified that expressions, e.g., those defined in dictionaries generally used, should be interpreted as if they had the meaning which is consistent with their meaning in the context of the relevant art, and should not be interpreted in an idealized or excessively formal sense, as long as this is not expressly defined herein.

In the context of the ever greater penetration of computer technology in the context of transportation vehicle development, the demand for computing power is also rising. In this regard, in the meantime some transportation vehicle systems are being developed using computationally intensive machine learning methods to enable, e.g., image recognition. However, traditional transportation vehicle development may also utilize powerful computer systems, e.g., in the context of computer simulations for crash computation or for the modeling of flow behavior. In some scenarios a demand for computing power in automotive development may continue to increase primarily as a result, too, of research in autonomous driving, and so the question may arise as to how this computing power can be provided as flexibly and cost-effectively as possible.

In other systems, attempts may be made to accomplish the required computing power by way of an extension/new construction of computation centers or by (leased) capacity provided over the internet (for instance, cloud capacity). In this context, setting up computation centers may be associated with high costs and in some cases may not make it possible to react flexibly to high computing power requirements. Cloud capacities may be more flexible, but may likewise necessitate setting up computation centers if the cloud capacity is established in-house. Externally leased cloud capacities may enable a higher flexibility, but may be regarded as critical from the standpoint of data protection, since the necessary, in part secret data (e.g., simulation data) may be transferred to a third-party provider in some scenarios. Generally, the extension by more computing power may be associated with significant costs, primarily for infrastructure and operation.

At least some exemplary embodiments provide a method and system for utilizing transportation vehicles as a distributed computer. By way of example, a transportation vehicle can be regarded as a compute unit. To that end, by way of example, a free (available) computing power of control units, such as, for instance, of an infotainment system (information and entertainment system) or of driver assistance systems, can be made available for computations. The connection via which the computations to be effected and the necessary data are exchanged can be provided, for example, via a mobile online service. In this case, a central office (which hereinafter may be referred to as, for example, Telematic Service Provider (TSP)), can enable a coordination for distributing the computation among the transportation vehicles and aggregation of the results.

In present-day transportation vehicles, powerful, highly parallelized hardware may be installed in some control units (e.g., Tegra processors in a modular infotainment kit system (MIB), active info display system (active information display) or a central driver assistance system (zFAS)). The basic assumption of some exemplary embodiments may be that the capacity of the control units is rarely fully utilized and the latter therefore have free resources for further computations. In addition, some transportation vehicle manufacturers may provide mobile online services in the context of which the infotainment system (e.g., MIB) and/or an online connectivity unit (OCU) may communicate with a TSP (e.g., modular backend kit (MBB)). In addition, it may be possible for the OCU, for instance, by way of a job mechanism, to be notified to initiate specific actions.

By way of example, in at least some exemplary embodiments, the computation may be carried out in the transportation vehicles rather than on dedicated computer hardware. At least some exemplary embodiments may be based on the computing power available in hundreds of thousands of produced transportation vehicles being made available cost-effectively. In this case, in some exemplary embodiments, there is no need to set up a new computation center or to lease cloud solutions, since program distribution, computation and communication of results can be handled by way of a mobile online service, for example, which the transportation vehicle owner has to activate. In this case, at least some exemplary embodiments may manage without a distributed file system, a complex security concept, etc., but rather may concentrate on being able to supply a high number of compute units with programs and data rapidly and robustly. At the same time there may be the possibility of allowing owners of the transportation vehicles to participate in this service by suitable incentives and thus also achieving the strengthening of a networking of the transportation vehicles. By way of example, it is possible to make available the free computational capacity of the control units in conjunction with the internet link being a "compute unit online service". For this purpose, it may be necessary for the user to activate the compute unit online service and to declare agreement with this use.

In some exemplary embodiments, the transportation vehicles may not have high availability, but in return may be very numerous and have powerful, embedded systems. The central office (for instance, the TSP) that undertakes resource allocation and distribution among transportation vehicles may be optimized toward dealing with compute units having low availability.

FIG. 1 shows a block diagram of an apparatus 10 for a transportation vehicle 100. The apparatus 10 comprises a communication module 12, configured for communication with a central office 200. The apparatus furthermore comprises a computation module 14, configured for controlling the communication module 12. The computation module 14 is furthermore configured for receiving a partial task of a distributed data processing from the central office 200, for instance, via the communication module 12. The computation module 14 is furthermore configured for computing the partial task of the distributed data processing to obtain a result of the partial task. The computation module 14 is furthermore configured for providing the result of the partial task for the central office 200, for instance, via the communication module 12. The communication module 12 is coupled to the computation module 14. Exemplary embodiments furthermore provide the transportation vehicle 100 comprising the apparatus 10 for the transportation vehicle.

Figure 1A:
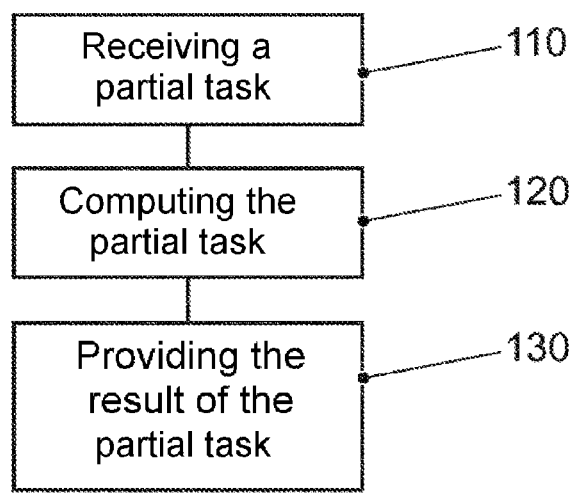
FIG. 1a shows a flow diagram of a method for a transportation vehicle.

FIG. 1a shows a flow diagram of a corresponding method for the transportation vehicle 100. The method comprises receiving 110 the partial task of the distributed data processing from the central office 200. The method furthermore comprises computing 120 the partial task of the distributed data processing to obtain the result of the partial task. The method furthermore comprises providing 130 the result of the partial task for the central office 200.

By way of example, the data processing can correspond to a parallelizable data processing or a segmentable data processing. By way of example, the data processing can correspond to a distributed machine learning algorithm or a simulation. The data processing can comprise, for example, a plurality of partial tasks. A partial task of the data processing can be, for example, a part of the data processing that is executable by an individual computation module. By way of example, the partial task can comprise information about instructions of the partial task and information about data of the partial task. The instructions of the partial task can relate to the data of the partial task. By way of example, the instructions of the partial task can process the data of the partial task. The information about the instructions of the partial task can comprise, for example, the instructions of the partial task or a reference to the instructions of the partial task. The information about the data of the partial task can comprise, for example, the data of the partial task or a reference to the data of the partial task. The computation module 14 can be configured to fetch the instructions of the partial task and/or the data of the partial task on the basis of the reference to the instructions or the reference to the data. If different partial tasks relate to the same data and/or the same instructions, then the computation module 14 can be configured to keep ready (to buffer-store) the data of the partial task and/or the instructions of the partial task.

Figure 2:
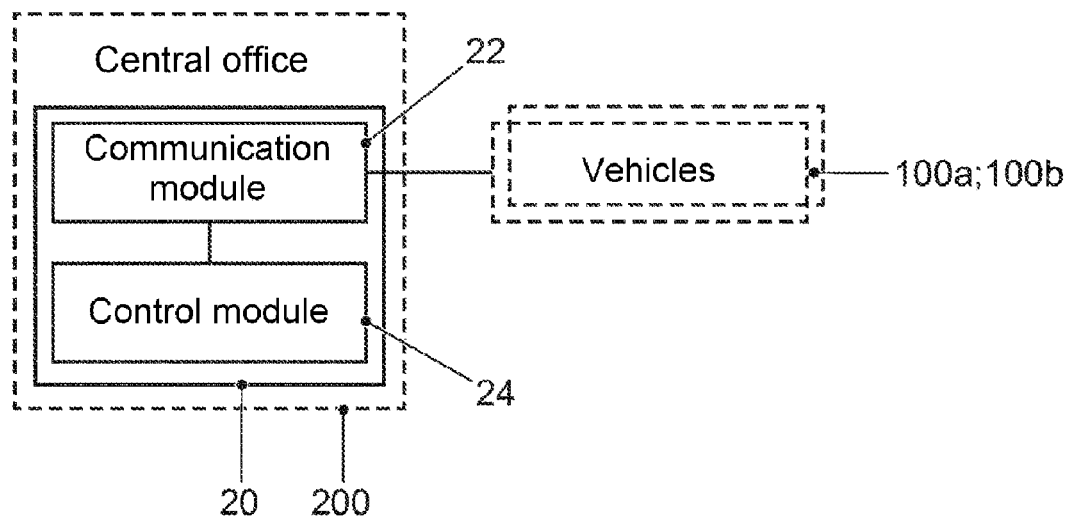
FIG. 2 shows a block diagram of an apparatus for a central office.

In at least some exemplary embodiments, the partial task can comprise instructions that are executable independently of a specific hardware architecture of a computation unit of a transportation vehicle (for instance, of a transportation vehicle of a plurality of transportation vehicles 100*a*; 100*b*, as introduced in FIG. 2). By way of example, the partial task can be based on a cross-hardware language, for example, on OpenCL (Open Computation Language) or on the basis of CUDA. Alternatively, the partial task can be based on a byte code, and the computation module 14 can be configured to interpret the byte code of the partial task.

By way of example, the partial tasks can be based on a framework via which programs can be written platform-independently, such that programs can run on different control units. Through the use of highly parallel GPUs, such a framework often already exists through the chip manufacturer or as an independent API. In this case, the transportation vehicle could then itself decide on which control unit the computation is intended to be carried out. Alternatively, the URL (Uniform Resource Locator, address) via which the transportation vehicle downloads the program could also be control-unit-specific to enable execution on different control units. By contrast, the data themselves can be independent thereof; the data can be stored, for example, such that all control units in the transportation vehicle can rapidly access them.

The computation module 14 can comprise, for example, two or more cores or compute units. By way of example, the computation module can comprise a processor having one or more cores for general computations and a processor having one or more cores/compute units for specialized computations (for instance, graphics computations). By way of example, the computation module can comprise an architecture having one instruction for a plurality of data sets or a stream processor comprised by the compute units for specialized computations. In at least some exemplary embodiments, the computation module 14 can be configured to carry out the computation of the result of the partial task at least partly (or wholly) on the compute units for specialized computations. By way of example, the computation module 14 can be configured to compute the partial task on the basis of the architecture having one instruction for a plurality of data sets or on the basis of the stream processor. In at least some exemplary embodiments, the computation module 14 can be configured to compute the result of the partial task with a low priority (for example, an idle priority). Since the main purpose of the control units resides in driving or convenience functions, the computation of the program, in at least some exemplary embodiments, cannot restrict these functionalities. Therefore, the computation can proceed with an idle priority, such that it can be rapidly superseded by regular computations.

In at least some exemplary embodiments, the computation module 14 can be configured to provide a notification about a non-availability of the transportation vehicle 100 for computing the partial task for the central office 200 if the apparatus 10 is deactivated before the partial task is computed. By way of example, the computation module 14 can be configured to provide a notification about an availability of the transportation vehicle 100 for computing the partial task for the central office 200, and an absence of the message for about the availability can indicate the (notification about the) non-availability of the transportation vehicle for computation. Alternatively, the computation module 14 can be configured, prior to a deactivation of the apparatus 10 or if a deactivation of the apparatus 10 before the end of the computation of the result of the partial task is foreseeable, to provide the notification about the non-availability of the transportation vehicle 100 to the central office.

By way of example, a transportation vehicle can regularly send a heartbeat to make it clear to the TSP that it is still available. The heartbeat could also be supplemented by further information, such as, e.g., CPU time expended hitherto. This could then enable the TSP to select further transportation vehicles if a transportation vehicle is no longer available or if it cannot expend computing power for the transmitted task on account of its regular mode of functioning. The central office can be configured, for example, for resource allocation, i.e., allocation of computations to transportation vehicles, and replanning if selected transportation vehicles are suddenly no longer available. The central office can be configured to attain the total availability by way of the high number of available transportation vehicles.

In at least some exemplary embodiments, the computation module 14 can furthermore be configured to communicate via the communication module 12 with one or a plurality of further transportation vehicles to exchange results of partial tasks with the one or the plurality of further transportation vehicles. By way of example, the computation module 14 can be configured to communicate with transportation vehicles in a vicinity of the transportation vehicle by nearest neighbor communication, for example, by direct vehicle-to-vehicle communication (also referred to as Car-2-Car Communication) or by frequency resources of a mobile communication system, for example, via a base station or with allocation of the frequency resources by a base station. The communication module 12 can be configured, for example, to communicate via at least one mobile communication system from the group of Global System for Mobile telecommunications (GSM), General Packet Radio Services (GPRS), Enhanced Data rates for GSM Evolution (EDGE), Universal Mobile Telecommunication System (UMTS), Long Term Evolution, and a 5th generation (5G) mobile radio system.

In one exemplary implementation, the job can initiate in the transportation vehicle (for example, in the computation module 14), by way of a transportation vehicle-specific URL, from a TSP, the interrogation and downloading of the program to be processed and the data required therefor. Ideally, it is possible in this case to concomitantly send (only) the data necessary for the computation to prevent a compromised transportation vehicle from obtaining confidential or secret data. By way of example, the computation (for instance, of the result of the partial task by the computation module 14) can be carried out afterward.

The communication module 12 (and/or a communication module 22 from FIG. 2) can correspond, for example, to one or more inputs and/or to one or more outputs for receiving and/or transmitting information, for instance, in digital bit values, on the basis of a code, within a module, between modules, or between modules of different entities. By way of example, the communication module 12 can be configured to communicate with the central office via a mobile communication network, for example, via an internal connection (transportation vehicle-manufacturer-specific connection, intranet) or via the internet. The communication module 22 can be configured to communicate with the transportation vehicle 100 via the mobile communication network, for example, via the internal connection or via the internet.

In exemplary embodiments, the computation module 14 can correspond to an arbitrary controller or processor or a programmable hardware component. By way of example, the computation module 14 can also be realized as software programmed for a corresponding hardware component. In this respect, the computation module 14 can be implemented as programmable hardware having correspondingly adapted software. Arbitrary processors, such as digital signal processors (DSPs), can be used here. In this case, exemplary embodiments are not restricted to a specific type of processor. Arbitrary processors or else a plurality of processors are conceivable for implementing the computation module 14.

The central office 200 can correspond, for example, to a central office as described in association with FIG. 2. In at least some exemplary embodiments, the transportation vehicle 100 could correspond, for example, to a land vehicle, a watercraft, an aircraft, a rail vehicle, a road vehicle, an automobile, a cross-country vehicle, a transportation vehicle, or a truck.

Figure 2A:
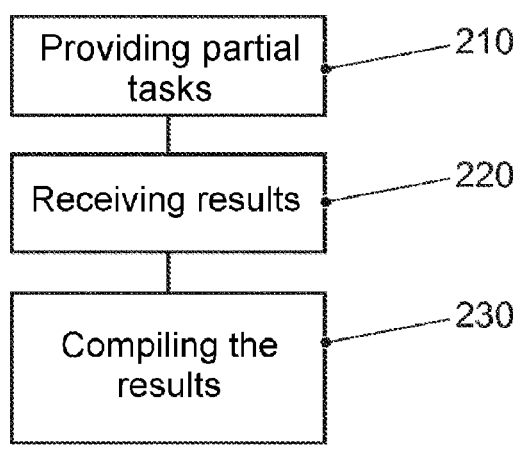
FIG. 2a shows a flow diagram of a method for a central office.

FIG. 2 shows a block diagram of an apparatus 20 for a central office 200. The apparatus 20 comprises a communication module 22, configured for communication with a plurality of transportation vehicles 100a; 100b. The plurality of transportation vehicles can comprise, for example, one or more transportation vehicles as introduced in association with FIG. 1. The apparatus 20 furthermore comprises a control module 24, configured for controlling the communication module 22. The control module 24 is furthermore configured for providing partial tasks of a distributed data processing for the plurality of transportation vehicles 100a; 100b for a distributed computation of the distributed data processing, for instance, via the communication module 22. The control module 24 is furthermore configured for receiving results of the partial tasks of the distributed data processing from the plurality of transportation vehicles 100a; 100b, for instance, via the communication module 22. The control module 24 is furthermore configured for compiling the results of the distributed data processing on the basis of the results of the partial tasks. The communication module 22 is coupled to the control module 24. Exemplary embodiments furthermore provide the central office 200 comprising the apparatus 20 for the central office. FIG. 2a shows a corresponding method for the central office 200. The method comprises providing 210 the partial tasks of the distributed data processing for the plurality of transportation vehicles 100a; 100b for the distributed computation of the distributed data processing. The method furthermore comprises receiving 220 results of the partial tasks of the distributed data processing from the plurality of transportation vehicles 100a; 100b. The method furthermore comprises compiling 230 the results of the distributed data processing on the basis of the results of the partial tasks.

By way of example, the control module 24 can be configured, for the purpose of providing the partial tasks for the plurality of transportation vehicles, actively to send (push) the partial tasks of the plurality of transportation vehicles or to provide (pull) the partial tasks on demand for the plurality of transportation vehicles. By way of example, the control module 24 can be configured, for the purpose of initiating the process of providing the partial tasks for the transportation vehicles of the plurality of transportation vehicles 100a; 100b, to contact the transportation vehicles of the plurality of transportation vehicles. Alternatively or additionally, the control module 24 can be configured, for the purpose of initiating the process of providing a partial task for a transportation vehicle of the plurality of transportation vehicles 100a; 100b, to receive a request of the transportation vehicle. By way of example, the control module 24 can be configured to provide an address-based interface for the plurality of transportation vehicles. By way of example, the address-based interface can refer to a web server or to a file server of the apparatus 20 or of the central office 200, which server comprises the partial tasks.

In at least one exemplary embodiment by way of example, each transportation vehicle could be part of a large, distributed file system (DFS) in which the data to be processed and also the results are stored.

In a further exemplary embodiment, the software used for distribution of programs, the data, for resource allocation and for computation could be mapped by the Hadoop ecosystem. Alternatively, a slimmer distributed software system that is more economical in respect of resources can be utilized for providing the partial tasks and/or receiving the results of the partial tasks.

In a further exemplary embodiment by way of example, the TSP could provide the transportation vehicles not just with a transportation vehicle-specific URL (address of the address-based interface) at which they download the program and the data, rather the TSP could push (actively provide) the program and the data directly into the transportation vehicle. Furthermore, in some exemplary embodiments, the transportation vehicle can itself decide when it carries out the download, for example, to wait for a route section with good mobile radio coverage.

By way of example, the control module 24 can be configured, for the purpose of receiving the results of the partial tasks, to provide an address-based interface for the plurality of transportation vehicles. By way of example, the address-based interface can refer to a web server or to a file server of the apparatus 20 or of the central office 200 with the possibility of storing the results of the partial tasks for the plurality of transportation vehicles. Alternatively, the control module 24 can be configured to receive direct data transmissions with the results for the partial tasks from the plurality of transportation vehicles.

In at least some exemplary embodiments, the control module 24 can be configured to select the plurality of transportation vehicles 100a; 100b from a group of transportation vehicles. By way of example, the control module 24 can comprise a data collection, for example, a database or a sorted or unsorted group, having information about the group of transportation vehicles. By way of example, selecting a transportation vehicle to be selected for the plurality of transportation vehicles can be based on at least one element from the group of system capacity utilization of a computation module of the transportation vehicle to be selected, energy capacity of the transportation vehicle to be selected, performance of the computation module of the transportation vehicle to be selected, connectivity of the transportation vehicle to be selected, position of the transportation vehicle to be selected, expected availability of the transportation vehicle to be selected for a computation of a partial task, previous processing of a partial task by the transportation vehicle to be selected, and prioritization of the transportation vehicle to be selected for computations.

By way of example, the data collection can at least one element of the group of information about the system capacity utilization of the computation module of the transportation vehicle to be selected, information about the energy capacity of the transportation vehicle to be selected, information about the performance of the computation module of the transportation vehicle to be selected, information about the connectivity of the transportation vehicle to be selected (for instance, to prefer transportation vehicles to be selected that have a higher transmission speed), information about the position of the transportation vehicle to be selected (for instance, for nearest neighbor communication), information about the expected availability of the transportation vehicle to be selected for the computation of the partial task, information about the previous processing of a partial task by the transportation vehicle to be selected, and information about the prioritization of the transportation vehicle to be selected for computations.

By way of example, the control module 24 can be configured to receive at least one element of the group of information about the system capacity utilization of the computation module of the transportation vehicle to be selected, information about the energy capacity of the transportation vehicle to be selected, information about the performance of the computation module of the transportation vehicle to be selected, information about the connectivity of the transportation vehicle to be selected, information about the position of the transportation vehicle to be selected, information about the expected availability of the transportation vehicle to be selected for the computation of the partial task, information about the previous processing of a partial task by the transportation vehicle to be selected, and information about the prioritization of the transportation vehicle to be selected for computations from the plurality of transportation vehicles for the data collection and to store the at least one element in the data collection.

By way of example, the control module 24 can be configured to obtain information about an activation of the apparatus 10 for a transportation vehicle from the plurality of transportation vehicles. The information about the activation of the apparatus 10 for a transportation vehicle can comprise, for example, information about a consent of an owner of the transportation vehicle for computing partial tasks. By way of example, the control module 24 can be configured to base selecting the transportation vehicle on the information about the activation of the transportation vehicle. The computation module 14 can be configured to provide the information about the activation.

By way of example, various strategies can be utilized for selecting the transportation vehicles that are intended to process a task. It may be essential that (only) transportation vehicles for which the compute unit service is activated are selected. For this purpose, in at least some exemplary embodiments, the TSP can comprise a database (data collection) with usable transportation vehicles, which can also comprise further additional information. Selection strategies may be, for example:

Transportation vehicles may regularly report the current system capacity utilization of their relevant control units; the TSP may then be select the transportation vehicles which last reported a low system capacity utilization Transportation vehicles may send information concerning their present energy capacity, such that, for instance, electric transportation vehicles having little remaining range do not have to carry out complex computations The selection may be effected, for example, on the basis of the available hardware, e.g., by giving preference to more powerful control units The selection can be effected on the basis of connectivity, for example, by giving preference to transportation vehicles which are linked via WLAN (Wireless Local Area Network) or have a measured, fast connection with low latency The selection of transportation vehicles may be effected on the basis of their location determined by GPS in combination with a digital map which maps the GPS position to the mobile radio coverage It is possible to select the transportation vehicles for which there is high probability that they will still be online for some time (e.g., because they are currently being charged at the socket or the navigation system is still reporting a long remaining travel time)

Preference may also be given to the transportation vehicles which, on account of a previous task, already have a portion of the data to be processed Transportation vehicles could be prioritized by flags (markers) to choose more often, for instance, experimental transportation vehicles or transportation vehicles preferred in the context of bonuses The selection may also be effected by a "Round Robin" approach, that is to say that each transportation vehicle is selected sometime so as not always to select the same transportation vehicles By way of example, a combination of a plurality of strategies may also be utilized. By way of example, the task (data processing) itself may predefine the subdivision of the program (into partial tasks), with the result that the TSP need not itself be concerned with parallelizing the program. In some exemplary embodiments, the task may make requirements regarding the number of necessary compute units; the TSP may select the necessary number of transportation vehicles. However, since the transportation vehicles may be compute units having low availability (e.g., on account of an unstable network connection, suddenly higher load requirements of the control units), for example, a larger number of transportation vehicles may be selected to compensate for the "failure" of compute units (more rapidly). In this regard, either each individual computation task (partial task) and the associated data could be distributed multiply or a logic may be used which selects the critical computation tasks (e.g., those which process a large amount of data) to allow them to be computed with redundancy. Furthermore, the multiple distribution may also be utilized in the case of stochastically manifested computations, thus to compute a plurality of variations in parallel and at the same time to have a redundancy as a result of multiple computation by different transportation vehicles.

Once the transportation vehicles have been selected, the TSP can send a job to these transportation vehicles. By way of example, the control module 24 can be configured to base providing the partial tasks on selecting the transportation vehicles for the plurality of transportation vehicles.

Furthermore, the TSP, by way of the job mechanism, can also initiate the termination of the computation of a task. The control module 24 can be configured to provide information about termination of the computation for the plurality of transportation vehicles.

In at least some exemplary embodiments, the control module 24 can be configured to provide the partial tasks multiply or in mutually overlapping state to the plurality of transportation vehicles 100*a*; 100*b*. By way of example, the control module 24 can be configured to provide a subset of computationally intensive or particularly relevant partial tasks multiply to the plurality of transportation vehicles. Alternatively or additionally, the control module 24 can be configured to provide a plurality of partial tasks to each transportation vehicle of the plurality of transportation vehicles, and to provide each partial task to more than one transportation vehicle.

By way of example, the control module 24 can be configured to provide partial tasks that are not computed within a time window by one transportation vehicle of the plurality of transportation vehicles 100*a*; 100*b* to another transportation vehicle of the plurality of transportation vehicles 100*a*; 100*b* for computation. By way of example, the time window can be at least 20% longer (or at least 50% longer, at least 100% longer) than an average computation duration for the partial tasks.

Alternatively or additionally, the control module 24 can be configured to provide a partial task that was provided to one transportation vehicle which is at least temporarily not available to another transportation vehicle of the plurality of transportation vehicles 100*a*; 100*b* for computation, for example, on the basis of a heartbeat or on the basis of a notification about an availability/non-availability of a transportation vehicle for computation. The control module 24 can be configured to receive information about the heartbeat or the notification about the availability/non-availability of the transportation vehicle for computation from transportation vehicles of the plurality of transportation vehicles.

Once a transportation vehicle has concluded its computation, it can be configured to send the results to the URL of the compute unit service. On the basis of the transportation vehicle information likewise available, the TSP may know which work packets have been processed. As soon as an acknowledgement is present for all of the work packets, the TSP can compile and pass the latter to the computer system for task feed-in, which computer system then in turn carries out or causes to be carried out the aggregation of the data to form an overall result. In a further exemplary embodiment, the TSP could itself aggregate the results for the compilation before forwarding the latter to the computer system for task feed-in.

By way of example, the control module 24 can be configured, for the purpose of compiling the results, to store the results in a data structure and to provide the data structure. Alternatively, the control module 24 can be configured, for the purpose of compiling the results, to aggregate a content of the results in a predefined format. By way of example, the compiled results may not comprise the received results.

The central office 200 can correspond, for example, to a server, a computer architecture, a computer infrastructure, a virtual server entity or a computation center.

In exemplary embodiments, the control device or the control module 24 can correspond to an arbitrary controller or processor or a programmable hardware component. By way of example, the control module 24 can also be realized as software that is programmed for a corresponding hardware component. In this respect, the control module 24 can be implemented as programmable hardware having correspondingly adapted software. Arbitrary processors, such as digital signal processors (DSPs), can be used here. In this case, exemplary embodiments are not restricted to a specific type of processor. Arbitrary processors or else a plurality of processors are conceivable for implementing the control module 24.

More details and properties of the apparatus 20 and of the method for the central office are mentioned in connection with the concept or examples described above (e.g., FIGS. 1 to 1*a*). The method and/or the apparatus 20 can comprise one or more additional optional features corresponding to one or more properties of the proposed concept or of the described examples such as have been described above or below.

Figure 3:
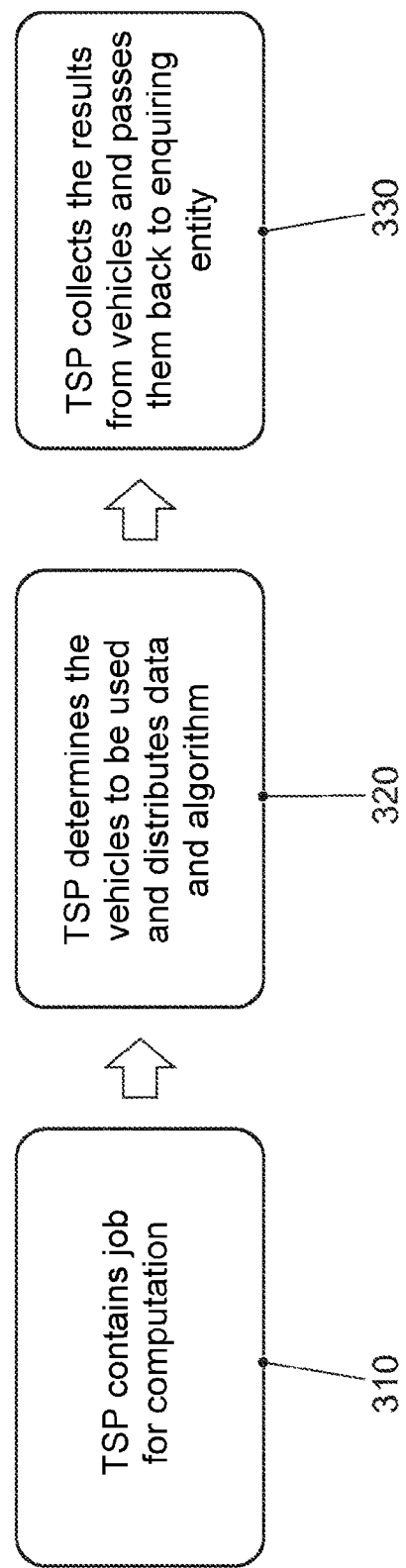
FIG. 3 shows a flow diagram of one exemplary method for a central office.

FIG. 3 shows a flow diagram of a method for a central office. By way of example, the central office (TSP) can receive a job for computation (of a data processing) (310). The TSP can determine the transportation vehicles to be used and distribute data and algorithm (320). Furthermore, the TSP can collect the results from the transportation vehicles and pass them back to the enquiring entity (330).

More details and properties of the method are mentioned in connection with the concept or examples described above (e.g., FIGS. 1 to 2*a*). The method can comprise one or more additional optional features corresponding to one or more properties of the proposed concept or of the described examples such as have been described above or below.

Figure 4:
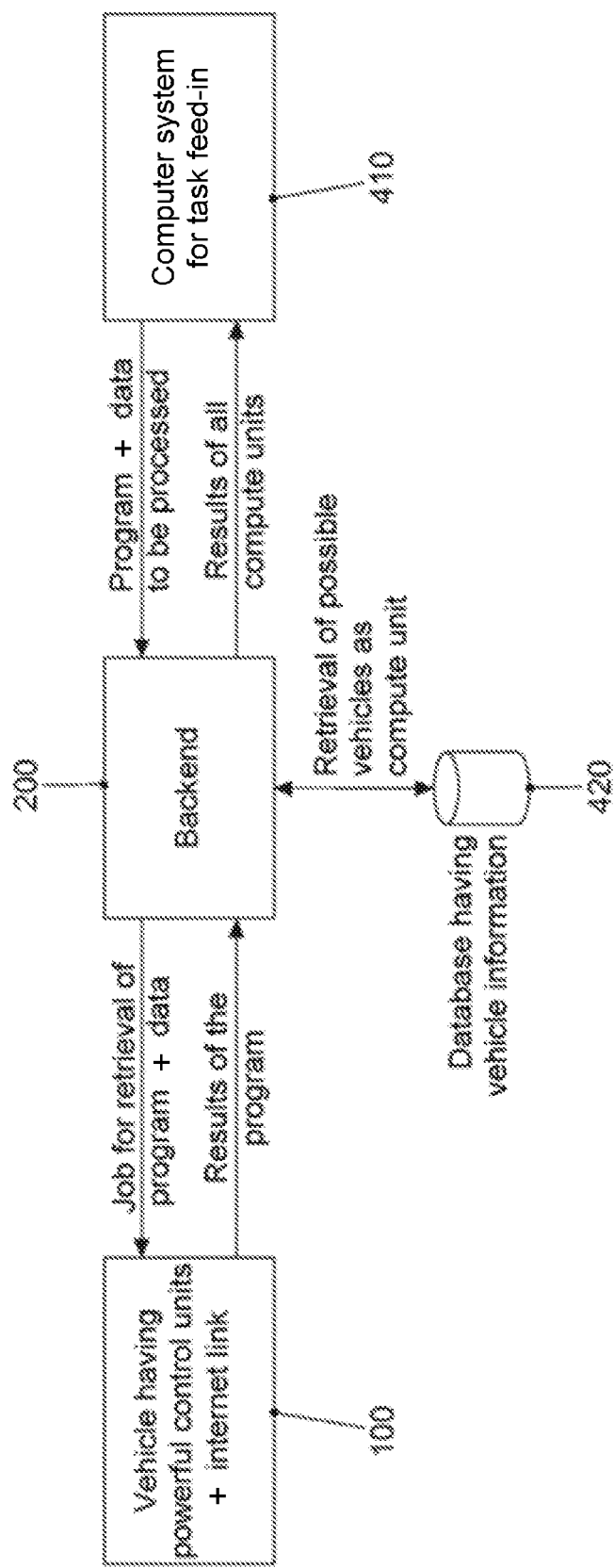
FIG. 4 shows a flow diagram of a system for computing a data processing.

FIG. 4 shows a flow diagram of a system for computing a data processing by a plurality of transportation vehicles. The system comprises a transportation vehicle 100 having powerful control units and an internet link. The system furthermore comprises a backend (central office) 200 coupled to a database 420 having transportation vehicle information (data collection). The system furthermore comprises a computer system 410 for task feed-in.

By the computer system 410, for instance, a portal, a database, etc., tasks (for instance, data processings) can be sent to the TSP (task feed-in) via an interface (for instance, the communication module 22). The central office 200 can be configured to receive information about the data processing from the computer system. The tasks can be parallelizable, for instance, by the use of the MapReduce programming paradigm, and computationally complex, but in return require relatively few data. Although a larger volume of data can also be employed, the transmission, on account of the internet link via mobile radio or WLAN, may require more time than is the case for traditional computer clusters. In addition, the task (for instance, the data processing) can also comprise further information, e.g., a priority or the number of compute units required, wherein a quota system can also be used for this purpose. The TSP can store this task under an ID (identification number) and can allocate resources.

In at least one exemplary embodiment by way of example, the computer system 410 provides the program and data to be processed (the data processing) to the backend 200. The backend retrieves possible transportation vehicles (as compute unit) from the data 420 and, on the basis thereof, provides a job for retrieval of program and data to a plurality of transportation vehicles, for example, to the transportation vehicle 100. The transportation vehicle 100 computes the program and provides results of the program (the result of the partial task) to the backend 200. The backend 200 provides the results of all transportation vehicles (compute units) to the computer system 410.

More details and properties of the system are mentioned in connection with the concept or examples described above (e.g., FIGS. 1 to 3). The system can comprise one or more additional optional features corresponding to one or more properties of the proposed concept or of the described examples such as have been described above or below.

A further exemplary embodiment is a computer program for carrying out at least one of the methods described above when the computer program runs on a computer, a processor or a programmable hardware component. A further exemplary embodiment is also a digital storage medium which is machine- or computer-readable and which has electronically readable control signals which can interact with a programmable hardware component such that one of the methods described above is performed.

The features disclosed in the description above, the following claims and the accompanying figures may be of importance and implemented both individually and in arbitrary combination for the realization of an exemplary embodiment in the various configurations thereof.

Although some properties have been described in association with an apparatus, it goes without saying that these properties also constitute a description of the corresponding method, and so a block or a component of an apparatus should also be understood as a corresponding method operation or as a feature of a method operation. Analogously thereto, properties that have been described in association with or as a method operation also constitute a description of a corresponding block or detail or feature of a corresponding apparatus.

Depending on specific implementation requirements, exemplary embodiments may be implemented in hardware or in software. The implementation may be carried out using a digital storage medium, for example, a floppy disk, a DVD, a Blu-Ray disk, a CD, a ROM, a PROM, an EPROM, an EEPROM or a FLASH memory, a hard disk or some other magnetic or optical store on which electronically readable control signals are stored which can interact or interact with a programmable hardware component in such a way that the respective method is carried out.

A programmable hardware component may be formed by a processor, a computer processor (CPU=Central Processing Unit), a graphics processor (GPU=Graphics Processing Unit), a computer, a computer system, an application-specific integrated circuit (ASIC), an integrated circuit (IC), a single-chip system (SOC=System on Chip), a programmable logic element or a field programmable gate array (FPGA) with a microprocessor.

The digital storage medium may therefore be machine- or computer-readable. Some exemplary embodiments thus comprise a data carrier having electronically readable control signals that are able to interact with a programmable computer system or a programmable hardware component in such a way that one of the methods described herein is carried out. At least one exemplary embodiment is thus a data carrier (or a digital storage medium or a computer-readable medium) on which the program for carrying out one of the methods described herein is recorded.

Generally, exemplary embodiments may be implemented as program, firmware, computer program or computer program product comprising a program code or as data, wherein the program code or the data is or are effective to the extent of carrying out one of the methods when the program runs on a processor or a programmable hardware component. The program code or the data may, for example, also be stored on a machine-readable carrier or data carrier. The program code or the data may be present, inter alia, as source code, machine code or byte code and as some other intermediate code.

A further exemplary embodiment is furthermore a data stream, a signal sequence or a sequence of signals constituting the program for carrying out one of the methods described herein. The data stream, the signal sequence or the sequence of signals may be configured, for example, to the effect of being transferred via a data communication connection, for example, via the internet or some other network. Exemplary embodiments are thus also signal sequences which represent data and which are suitable for communication via a network or a data communication connection, wherein the data constitute the program.

A program in accordance with at least one exemplary embodiment may implement one of the methods during its performance, for example, by virtue of the fact that it reads memory locations or writes a datum or a plurality of data thereto, as a result of which possibly switching processes or other processes are brought about in transistor structures, in amplifier structures or in other electrical components, optical components, magnetic components or components that operate according to some other functional principle. Accordingly, by reading a memory location, it is possible for data, values, sensor values or other information to be acquired, determined or measured by a program. A program can therefore acquire, determine or measure variables, values, measurement variables and other information by reading from one or more memory locations and also, by writing to one or more memory locations, can bring about, instigate or carry out an action and also drive other apparatuses, machines and components.

The exemplary embodiments described above merely constitute an illustration of the principles of the disclosed embodiments. It goes without saying that modifications and variations of the arrangements and details described herein will become apparent to others skilled in the art. Therefore, the intention is that the disclosure shall be restricted only by the scope of protection of the following patent claims and not by the specific details that have been presented on the basis of the description and the explanation of the exemplary embodiments herein.

LIST OF REFERENCE SIGNS

10 Apparatus for a transportation vehicle
12 Communication module
14 Computation module
20 Apparatus for a si
22 Communication module
24 Control module
100 Transportation vehicle
110 Receiving a partial task
120 Computing the partial task
130 Providing a result of the partial task
200 Central office
210 Providing partial tasks
220 Receiving results
230 Compiling the results
310 TSP receives job for computation
320 TSP determines the transportation vehicles to be used and distributes data and algorithm
330 TSP collects the results from transportation vehicles and passes them back to enquiring entity
410 Computer system
420 Database

The invention claimed is:

1. An apparatus for a transportation vehicle, the apparatus comprising:
   a communication module for communication with a central office; and
   a computation module configured for:
      controlling the communication module to receive instruction to complete a partial task included in a distributed data processing process from the central office, wherein the distributed data processing process corresponds to a parallelizable data processing of a distributed machine learning algorithm or a simulation, and wherein partial tasks of the distributed data processing process are provided to a plurality of transportation vehicles including the transportation vehicle such that the partial tasks are sent to multiple ones of the plurality of transportation vehicles from the central office,
      calculating the instructed partial task of the distributed data processing process to obtain a result of the instructed partial task, and
      providing the result of the instructed partial task to the central office.

2. The apparatus of claim 1, wherein the computation module provides a notification about a non-availability of the transportation vehicle to compute the instructed partial task for the central office in response to the apparatus being deactivated before the instructed partial task is computed.

3. The apparatus of claim 1, wherein the computation module computes the instructed partial task based on an architecture having one instruction for a plurality of data sets or based on a stream processor.

4. The apparatus of claim 1, wherein the computation module communicates via the communication module with one or a plurality of further transportation vehicles of the plurality of transportation vehicles to exchange results of the instructed partial tasks with the one or the plurality of further transportation vehicles.

5. A method for a transportation vehicle, the method comprising:
   receiving instruction to complete a partial task included in a distributed data processing process from a central office, wherein the distributed data processing process corresponds to a parallelizable data processing process of a distributed machine learning algorithm or a simulation, and wherein partial tasks of the distributed data processing process are provided to a plurality of transportation vehicles including the transportation vehicle such that the partial tasks are sent to multiple ones of the plurality of transportation vehicles from the central office;
   computing the instructed partial task of the distributed data processing to obtain a result of the instructed partial task; and
   providing the result of the instructed partial task to the central office.

6. A non-transitory computer readable medium including a computer program that includes a program code for carrying out a method for a transportation vehicle when the program code is executed on a computer, a processor, a control module or a programmable hardware component, the method comprising:
   receiving instruction to complete a partial task included in a distributed data processing process from a central office, wherein the distributed data processing process corresponds to a parallelizable data processing process of a distributed machine learning algorithm or a simulation thereof, and wherein partial tasks of the distributed data processing process are provided to a plurality of transportation vehicles including the transportation vehicle such that the partial tasks are sent to multiple ones of the plurality of transportation vehicles from the central office;
   computing the instructed partial task of the distributed data processing process to obtain a result of the partial task; and
   providing the result of the instructed partial task to the central office.

* * * * *